United States Patent
Liu

(10) Patent No.: US 6,511,139 B2
(45) Date of Patent: Jan. 28, 2003

(54) MODULARIZED INDUSTRIAL CONSOLE

(76) Inventor: Cheng Kuo Liu, 3F, No. 143, Sec. 3, Huan Ho S. Rd., Wan Hua Dist., Taipei (TW)

( * ) Notice: Subject to any disclaimer, the term of this patent is extended or adjusted under 35 U.S.C. 154(b) by 0 days.

(21) Appl. No.: 09/879,138

(22) Filed: Jun. 13, 2001

(65) Prior Publication Data

US 2002/0190613 A1 Dec. 19, 2002

(51) Int. Cl.⁷ .............................................. A47B 81/00
(52) U.S. Cl. .................................... 312/223.2; 361/725
(58) Field of Search ......................... 312/223.1, 223.2, 312/334.7, 334.8, 330.1, 223.3; 361/683, 684, 685, 686, 687, 725, 727

(56) References Cited

U.S. PATENT DOCUMENTS

| | | | | |
|---|---|---|---|---|
| 5,626,406 A | * | 5/1997 | Schmid ............... | 312/223.2 X |
| 5,761,033 A | * | 6/1998 | Wilhelm ................ | 361/725 X |
| 5,877,938 A | * | 3/1999 | Hobbs et al. ......... | 312/223.2 X |
| 5,912,801 A | * | 6/1999 | Roy et al. ............ | 312/223.1 X |
| 5,949,645 A | * | 9/1999 | Aziz et al. ........... | 312/223.2 X |
| 6,137,684 A | * | 10/2000 | Ayd et al. .................... | 361/727 |
| 6,181,552 B1 | * | 1/2001 | Neville, Jr. et al. ..... | 361/725 X |
| 6,201,690 B1 | * | 3/2001 | Moore et al. ......... | 312/223.2 X |
| 6,219,235 B1 | * | 4/2001 | Diaz et al. ........... | 312/223.2 X |
| 6,266,237 B1 | * | 7/2001 | Jensen et al. ........... | 361/725 X |
| 6,307,750 B1 | * | 10/2001 | Bendikas et al. ........... | 361/725 |
| 6,373,707 B1 | * | 4/2002 | Hutchins .................... | 361/725 |

FOREIGN PATENT DOCUMENTS

| | | | | |
|---|---|---|---|---|
| DE | 4013985 | * | 11/1991 | .................. 361/725 |
| JP | 04152598 | * | 5/1992 | .................. 361/727 |
| JP | 05191066 | * | 7/1993 | .................. 361/727 |

* cited by examiner

Primary Examiner—Lanna Mai
Assistant Examiner—Hanh V. Tran
(74) Attorney, Agent, or Firm—Rabin & Berdo, P.C.

(57) ABSTRACT

A modularized industrial console includes a fixing frame, an operative module, a supporting horizontal bar, an optional function module, two sliding blocks, and two sliding grooves. The fixing frame is retained on an industrial rack and assembled with the supporting horizontal bar and the two sliding grooves. The operative module is arranged on a front side of the assembled fixing frames and the optional function module is arranged on a rear side of the assembled fixing frames. With the help of switch functions of KVM (keyboard, video and mouse), the modularized industrial console prevents undue purchase and stockage.

6 Claims, 5 Drawing Sheets

MODULARIZED INDUSTRIAL CONSOLE

FIELD OF THE INVENTION

The present invention relates to a modularized industrial console, especially to a modularized industrial console for industrial rack to save cost.

BACKGROUND OF THE INVENTION

As shown in FIG. 1, the prior art industrial console comprises a frame 10 with standardized size to assemble the frame 10 on an industrial rack (not shown). The frame 10 contains a shell 11 and a modular structure 12, wherein the shell 11 has a plurality of operative buttons and displays (not shown) and the modular structure 12 has a plurality of interfaces (not shown) for user. The shell 11 and the modular structure 12 are connected by a cable 13 to provide data transmission therein.

The shell 11 and the modular structure 12 are fixed within the frame 10. The frame 10, the shell 11 and the modular structure 12 are locked to the industrial rack. The relevant interfaces of the modular structure 12 are connected to the operative buttons and displays of the shell 11 through the cable 13 to facilitate operation for user.

However, in above-mentioned industrial console, the shell 11 and the modular structure 12 are not separable. In other word, each modular structure 12 is assembled with a shell 11. The shell 11 is generally provided with expensive LCD panel. Therefore, shells 11 with numbers equal to that of the modular structure 12 are required to assemble integral industrial console even though only part of the interfaces of the modular structure 12 are used. The provision of the shells 11 wastes considerable cost.

SUMMARY OF THE INVENTION

It is the object of the present invention to provide a modularized industrial console for industrial rack, which has modularized and detachable components and the expensive components thereof can be repeatedly used to save cost.

To achieve above object, the present invention provides a modularized industrial console comprising a fixing frame, an operative module, a supporting horizontal bar, an optional function module, two sliding blocks, and two sliding grooves. The fixing frame is retained on an industrial rack and assembled with the supporting horizontal bar and the two sliding grooves. The operative module is arranged on front side of the assembled fixing frames and the optional function module is arranged on rear side of the assembled fixing frames. With the help of switch functions of KVM (keyboard, video and mouse), the modularized industrial console prevents undue purchase and stockage.

The various objects and advantages of the present invention will be more readily understood from the following detailed description when read in conjunction with the appended drawing, in which:

DETAILED DESCRIPTION OF THE INVENTION

Figure 1:
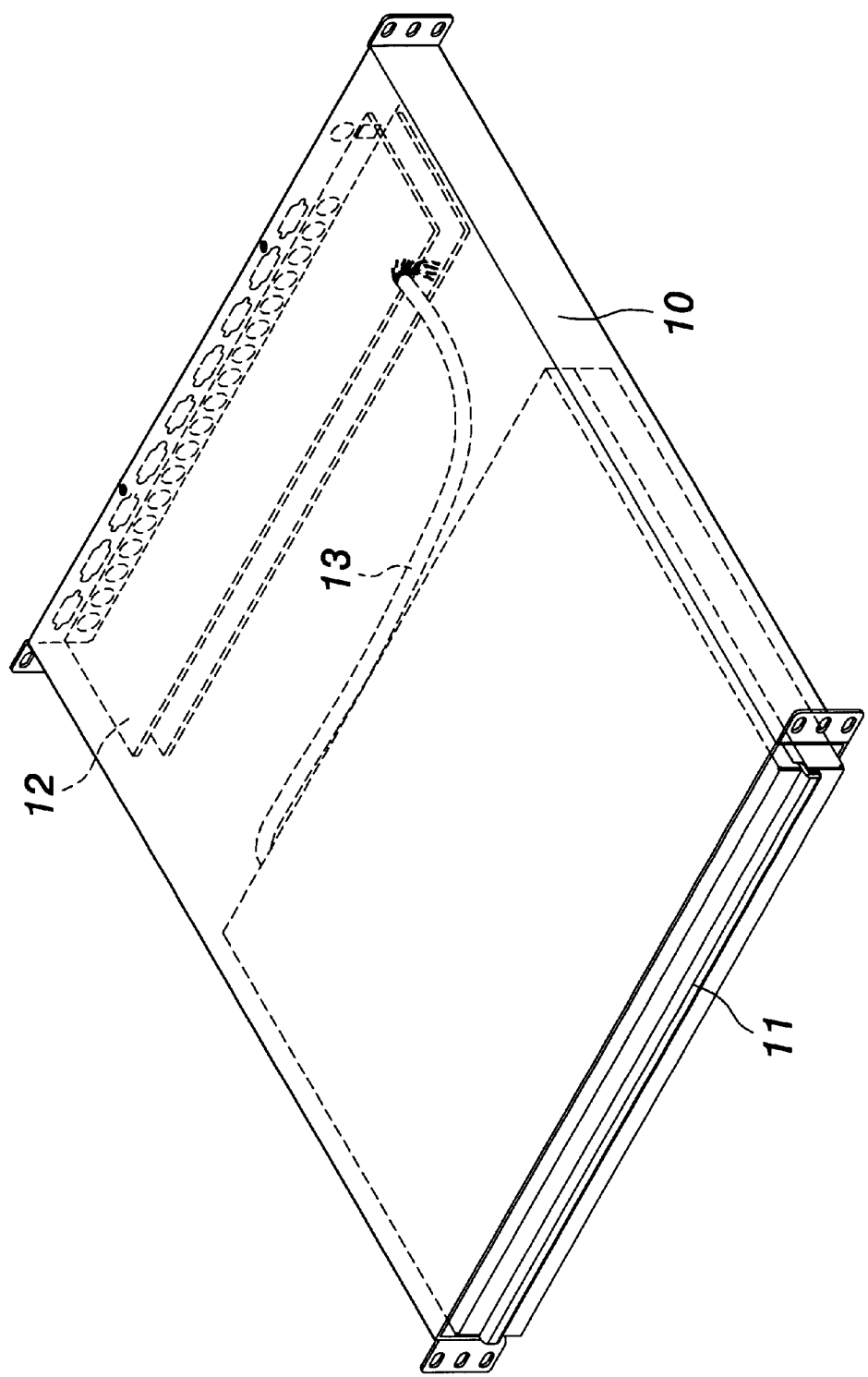
FIG. 1 the perspective view of prior art industrial console.

With reference now to FIGS. 2, 3, 4 and 5, the present invention is intended to provide a modularized industrial console for an industrial rack to save [cost] costs and providing multiple functions. The modularized industrial console of the present invention comprises a fixing frame 20, an operative module 30, a supporting horizontal bar 24, an optional function module 40, two sliding blocks 60, and two sliding grooves 50.

Figure 5:
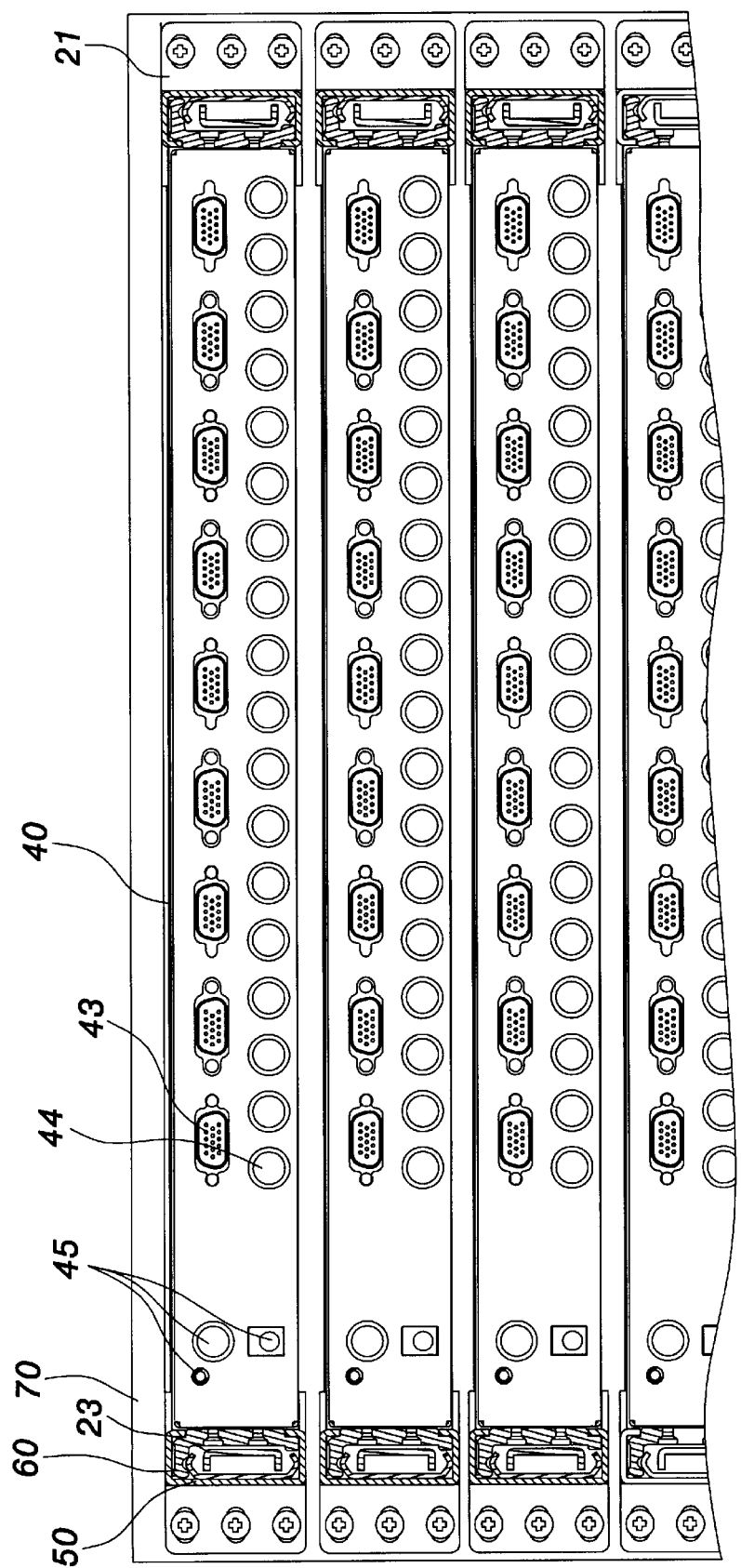
FIG. 5 shows the planar view of the modularized industrial console of the present invention.

The fixing frame 20 is made of metal and [of] has an H shape. The fixing frame 20 has a standardized size and shape to assemble the fixing frame 20 on an industrial rack 70, as shown in FIG. 5. Each fixing frame 20 has two lugs 21 on front side thereof and the lugs 21 are assembled to both sides of the industrial rack 70. The lug 21 has a plurality of clamping holes 211 to facilitate the clamping of the lug 21 on the industrial rack 70.

The fixing frame 20 has a plurality of fixing units 212 on both sides thereof and connected to the operative module 30. For example, the fixing units 212 can be screws or rivets. The operative module 30 is composed of an upper cover 31 and a lower cover 32 pivotally connected through a pivotal part 35. The upper cover 31 can be opened through the pivotal part 35. The operative module 30 contains a plurality of buttons (not shown) and LCD panels (not shown) therein and the upper cover 31 has an arc-shaped handle 311 on a front side thereof to facilitate the user to open the upper cover 31.

The fixing frame 20 has a first shaft 22 and a second shaft 23 on both sides thereof and a supporting horizontal bar 24 is provided at a center of the fixing frame 20. The first shaft 22 is separated [with] from the second shaft 23 and the two shafts are assembled to the optional function module 40. Moreover, the first shaft 22 and the second shaft 23 have a plurality of thread holes 245 on both sides thereof, which are assembled to the sliding grooves 50 through a plurality of screws 51.

Figure 2:
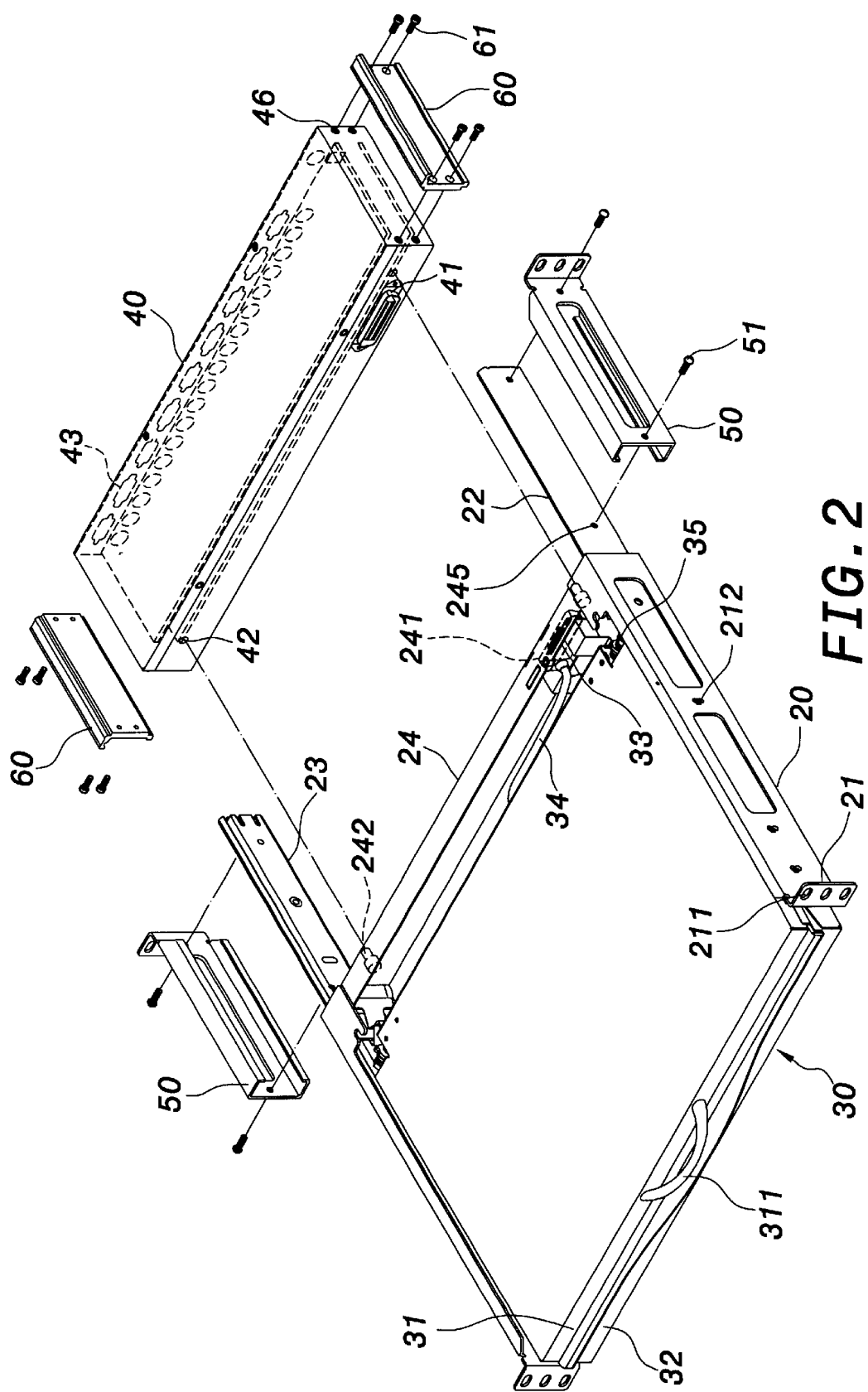
FIG. 2 shows the exploded view of the modularized industrial console of the present invention.

The optional function module 40 is detachably assembled on one side of the fixing frame 20. The optional function module 40 has a first connector 41 on a front side thereof, as shown in FIG. 2. The first connector 41 has outer flange fit with an opening 241 on the supporting horizontal bar 24, and the first connector 41 passes through the opening 241 and is connected to a third connector 33 on the operative module 30. The operative module 30 has a transmission cable 34 through which the signal from the optional function module 40 can be sent to the operative module 30. More particularly, the interfaces of the optional function module 40 communicate the buttons and display panel of the operative module 30 through the first connector 41, the transmission cable 34 and the third connector 33 to facilitate the data accessing of the optional function module 40.

The optional function module 40 has a locking groove 42 on a front side thereof and is corresponding to a locking bump 242 on the supporting horizontal bar 24. The locking groove 42 is locked with the locking bump 242 to enhance the assembling force between the fixing frame 20 and the optional function module 40 and prevent the detaching of the first connector 41 from the third connector 33. Therefore, the interfaces of the optional function module 40 have confidential connection with the operative module 30.

As shown in FIG. 5, the optional function module 40 has a plurality of second connectors 43, a plurality of sockets 44 and a plurality of connection ports 45 on rear side thereof to provide the optional function module 40 with external connection, expansion and update ability.

Figure 3:
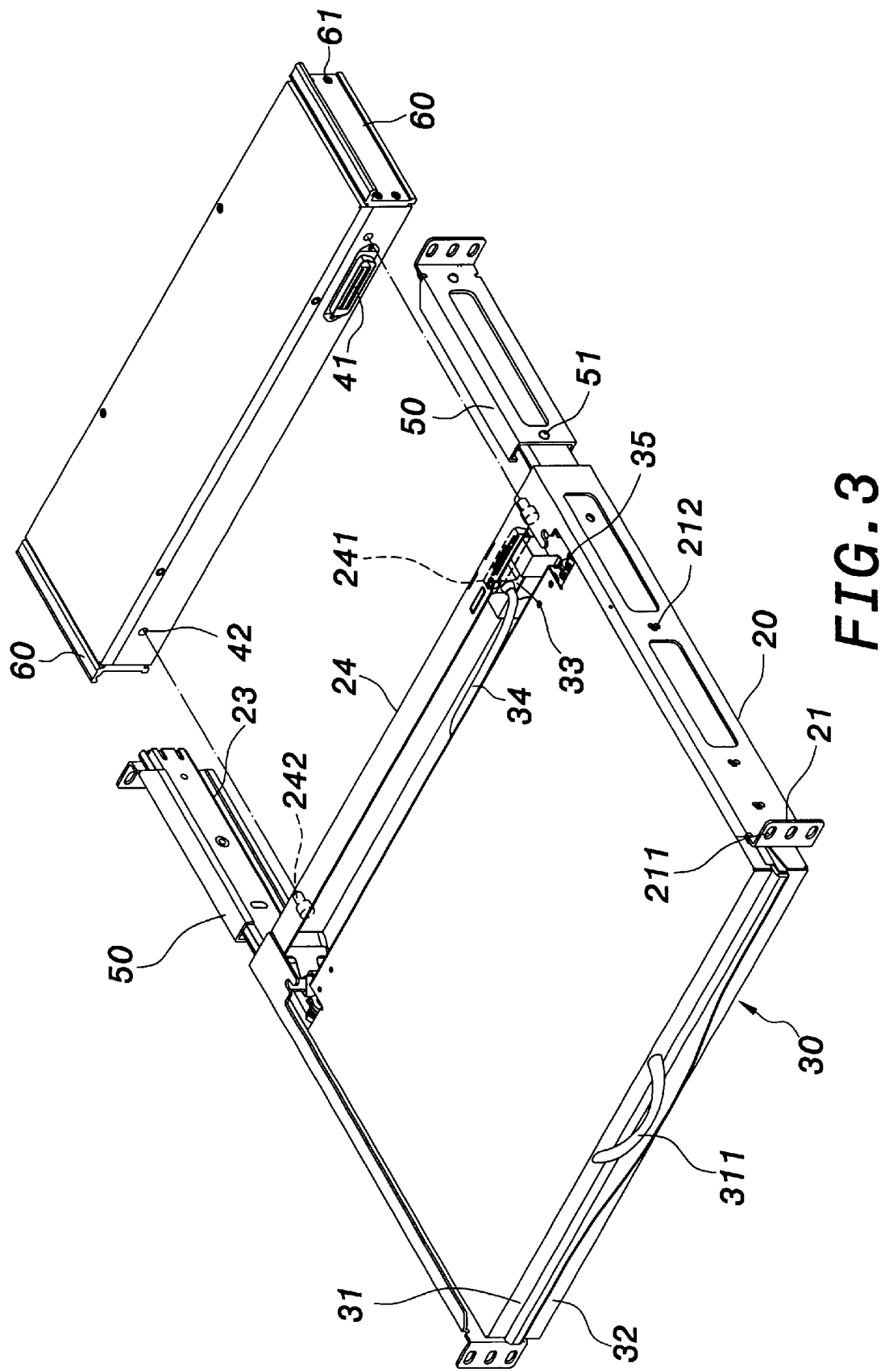
FIG. 3 shows the assembling of the modularized industrial console of the present invent
Figure 4:
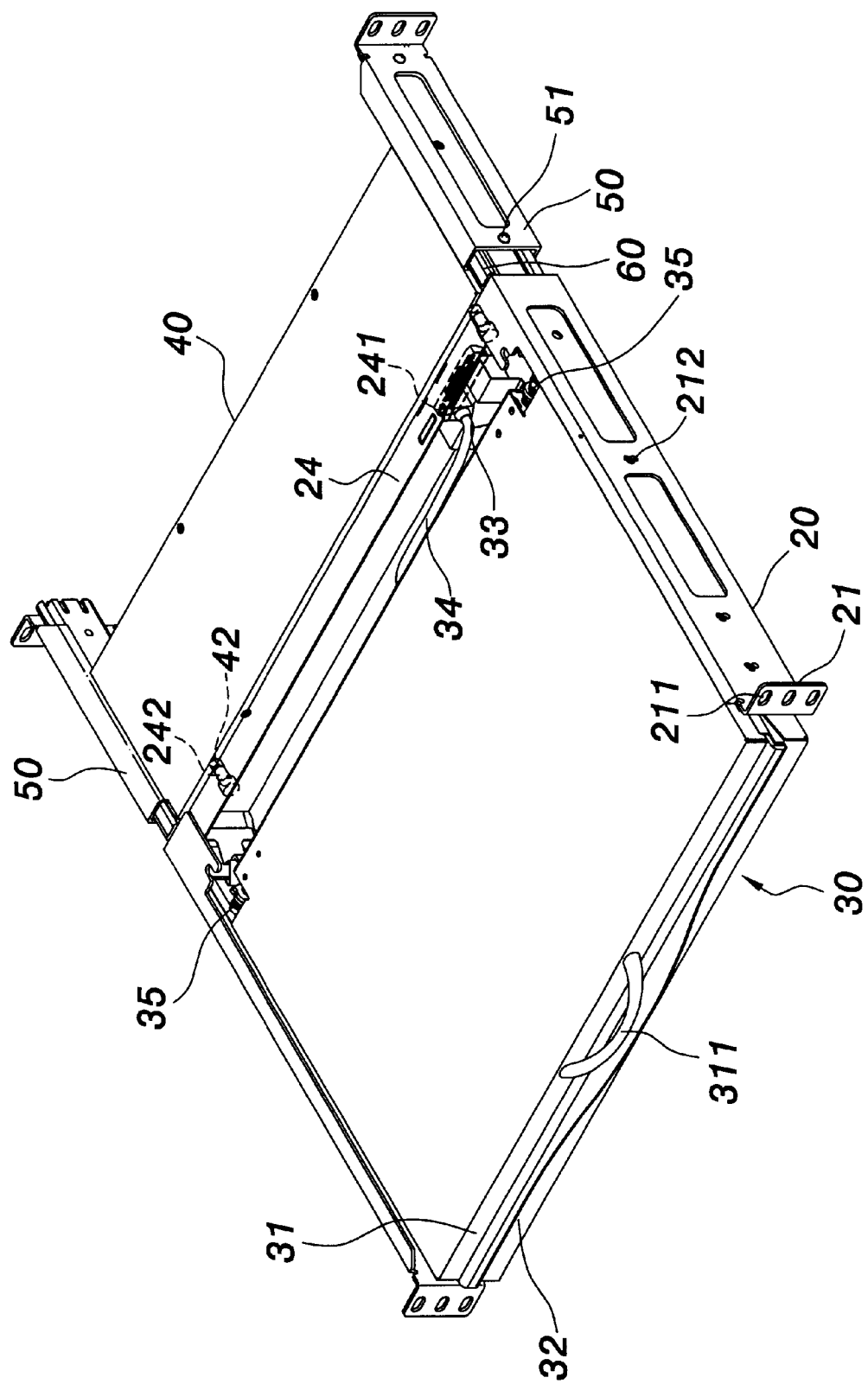
FIG. 4 shows the perspective view of the modularized industrial console of the present invention.

The two sliding grooves 50 are screwed to the first shaft 22 and the second shaft 23 of the fixing frame 20 by a plurality of screws 51, as shown in FIG. 3. The optional function module 40 is screwed to the two sliding blocks 60 by a plurality of screws 61 on two lateral sides thereof. The two sliding blocks 60 can be slidably moved within the two outer sliding grooves 50. Alternatively, the two sliding blocks 60 can be slid out of the two outer sliding grooves 50 such that the optional function module 40 can be replaced.

The length of the composite structure including the first shaft 22 and the second shaft 23 of the fixing frame 20, the two sliding blocks 60 and the two outer sliding grooves 50 can be increased or decreased with respect to the length of the operative module 30 or the optional function module 40. Therefore, the length of the composite structure can be adapted to fit the operative modules 30 with different lengths. Alternatively, the length of the optional function module 40 can also be increased or decreased to modify the interfaces thereof.

In the present invention, the fixing frame is connected to the operative module 30 and the first shaft 22 and the second shaft 23 of the fixing frame 20 are connected to the two sliding grooves 50 and the two sliding blocks 60. The two sliding blocks 60 can be slidably moved within the two outer sliding grooves 50. Alternatively, the two sliding blocks 60 can be slid out of the two outer sliding grooves 50 such that the optional function module 40 can be replaced. The buttons and LCD panels of the operative module 30 can be repeatedly used. The undue purchase and stockage of the operative module 30 can be prevented.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A modularized industrial console, comprising a fixing frame;

an operative module arranged on one side of the fixing frame; and an optional function module detachably arranged on another side of the fixing frame, wherein the operative module has an upper cover and a lower cover pivotally connected through a pivotal part, the upper cover having an arc-shaped handle on a front side thereof to facilitate the opening of the upper cover by a user.

2. The modularized industrial console as in claim 1, wherein the fixing frame is arranged on an industrial rack and has two lugs on a front side thereof, each lug having a plurality of clamping holes to facilitate the clamping of the fixing frame on the industrial rack.

3. The modularized industrial console as in claim 1, wherein the fixing frame is connected to the operative module by a plurality of screws or rivets.

4. The modularized industrial console as in claim 1, wherein the optional function module has two sliding blocks on both sides thereof, and the fixing frame has two sliding grooves on a rear side thereof and corresponding to the two sliding blocks.

5. The modularized industrial console as in claim 1, wherein the optional function module has a locking groove on a front side thereof and corresponds to and locked to a locking bump on the fixing frame to enhance an assembling force between the fixing frame and the optional function module.

6. The modularized industrial console as in claim 1, wherein the optional function module has a plurality of second connectors, a plurality of sockets and a plurality of connection ports to provide the optional function module with external connection, expansion and update ability.

\* \* \* \* \*